United States Patent
Su et al.

(10) Patent No.: US 8,148,241 B2
(45) Date of Patent: Apr. 3, 2012

(54) INDIUM SURFACTANT ASSISTED HVPE OF HIGH QUALITY GALLIUM NITRIDE AND GALLIUM NITRIDE ALLOY FILMS

(75) Inventors: Jie Su, Santa Clara, CA (US); Olga Kryliouk, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 34 days.

(21) Appl. No.: 12/842,896

(22) Filed: Jul. 23, 2010

(65) Prior Publication Data

US 2011/0027974 A1   Feb. 3, 2011

Related U.S. Application Data

(60) Provisional application No. 61/230,451, filed on Jul. 31, 2009.

(51) Int. Cl.
*H01L 21/36* (2006.01)

(52) U.S. Cl. ........ 438/478; 438/483; 438/486; 438/572; 438/779; 257/E21.398; 257/E21.09; 257/E21.097; 257/E21.108; 257/E21.117; 257/E21.118; 257/E21.125; 257/E21.126; 257/E21.138; 257/E21.173

(58) Field of Classification Search ................ None
See application file for complete search history.

(56) References Cited

U.S. PATENT DOCUMENTS

| | | | |
|---|---|---|---|
| 5,208,821 A | 5/1993 | Berger et al. | |
| 5,316,615 A * | 5/1994 | Copel et al. | 117/95 |
| 6,086,673 A | 7/2000 | Molnar | |
| 6,146,457 A | 11/2000 | Solomon | |
| 6,163,557 A | 12/2000 | Dunnrowicz et al. | |
| 6,218,280 B1 | 4/2001 | Kryliouk et al. | |
| 6,348,096 B1 | 2/2002 | Sunakawa et al. | |
| 6,350,666 B2 | 2/2002 | Kryliouk | |
| 6,440,823 B1 | 8/2002 | Vaudo et al. | |
| 6,486,499 B1 | 11/2002 | Krames et al. | |
| 6,514,782 B1 | 2/2003 | Wierer, Jr. et al. | |
| 6,521,914 B2 | 2/2003 | Krames et al. | |
| 6,599,362 B2 | 7/2003 | Ashby et al. | |
| 6,632,725 B2 | 10/2003 | Trassoudaine et al. | |
| 6,656,272 B2 | 12/2003 | Tsvetkov et al. | |
| 6,660,083 B2 | 12/2003 | Tsvetkov et al. | |
| 6,699,760 B2 | 3/2004 | Hsu et al. | |

(Continued)

OTHER PUBLICATIONS

Yu et al. ("Indium assisted hydride vapor phase expitaxy of GaN", J. of Ceramic Processing Research, 7(2), pp. 180-182, 2006).*

(Continued)

*Primary Examiner* — Charles Garber
*Assistant Examiner* — Yasser Abdelaziez
(74) *Attorney, Agent, or Firm* — Blakely, Sokoloff, Taylor & Zafman LLP

(57) ABSTRACT

One embodiment of depositing a gallium nitride (GaN) film on a substrate comprises providing a source of indium (In) and gallium (Ga) and depositing a monolayer of indium (In) on the surface of the gallium nitride (GaN) film. The monolayer of indium (In) acts as a surfactant to modify the surface energy and facilitate the epitaxial growth of the film by suppressing three dimensional growth and enhancing or facilitating two dimensional growth. The deposition temperature is kept sufficiently high to enable the indium (In) to undergo absorption and desorption on the gallium nitride (GaN) film without being incorporated into the solid phase gallium nitride (GaN) film. The gallium (Ga) and indium (In) can be provided by a single source or separate sources.

8 Claims, 10 Drawing Sheets

U.S. PATENT DOCUMENTS

| | | | |
|---|---|---|---|
| 6,733,591 B2 | 5/2004 | Anderson |
| 6,784,085 B2 | 8/2004 | Cuomo et al. |
| 6,864,158 B2 | 3/2005 | Ishida |
| 6,903,374 B2 | 6/2005 | Katayama |
| 6,936,851 B2 | 8/2005 | Wang |
| 6,943,095 B2 | 9/2005 | Vaudo et al. |
| 6,956,246 B1 | 10/2005 | Epler et al. |
| 6,986,693 B2 | 1/2006 | Chowdhury et al. |
| 7,001,813 B2 | 2/2006 | Manfra et al. |
| 7,084,563 B2 | 8/2006 | Chowdhury et al. |
| 7,087,930 B2 | 8/2006 | Senda et al. |
| 7,208,337 B2 | 4/2007 | Eisert et al. |
| 7,220,314 B2 | 5/2007 | Fukuyama et al. |
| 7,220,658 B2 | 5/2007 | Haskell et al. |
| 7,221,000 B2 | 5/2007 | Shen et al. |
| 7,259,402 B2 | 8/2007 | Edmond et al. |
| 7,297,625 B2 | 11/2007 | Nakahata et al. |
| 7,341,878 B2 | 3/2008 | Krames et al. |
| 7,348,600 B2 | 3/2008 | Narukawa et al. |
| 7,384,809 B2 | 6/2008 | Donofrio |
| 7,419,912 B2 | 9/2008 | Donofrio |
| 7,420,218 B2 | 9/2008 | Nagai |
| 7,456,035 B2 | 11/2008 | Eliashevich et al. |
| 7,468,578 B2 | 12/2008 | Chowdhury et al. |
| 7,473,315 B2 | 1/2009 | Nakahata et al. |
| 7,491,565 B2 | 2/2009 | Coman et al. |
| 7,501,299 B2 | 3/2009 | Wong et al. |
| 7,511,307 B2 | 3/2009 | Wuu et al. |
| 7,527,742 B2 | 5/2009 | Tysoe et al. |
| 2001/0042865 A1 | 11/2001 | Oshio et al. |
| 2002/0140013 A1* | 10/2002 | Yu et al. ................ 257/295 |
| 2004/0119078 A1 | 6/2004 | Konno et al. |

OTHER PUBLICATIONS

Y.K. Su et al., "InGaN/GaN Light Emitting Diodes with a p-Down Structure", IEEE Transactions on Electron Devices, vol. 49, No. 8, Aug. 2002, pp. 1361-1366.

F.K. Yam et al., "Innovative Advances in LED Technology", Microelectronics Journal 36 (2005), pp. 129-137.

John E. Northrup et al., "Indium Versus Hydrogen-Terminated GaN(0001) Surfaces: Surfactant Effect of Indium in a Chemical Vapor Deposition Environment", 2004 American Institute of Physics, Applied Physics Letters, vol. 84, No. 21, May 24, 2004, pp. 4322-4324.

C.K. Shu et al., "Isoelectronic In-doping Effect in GaN Films Grown by Metalorganic Chemical Vapor Deposition", 1998 American Institute of Physics, Applied Physics Letters, vol. 73, No. 6, Aug. 3, 1998, pp. 641-643.

F. Widmann et al., "Improved Quality GaN Grown by Molecular Beam Epitaxy Using In as a Surfactant", 1998 American Institute of Physics, Applied Physics Letters, vol. 73, No. 18, Nov. 2, 1998, pp. 2642-2644.

S. Keller et al., "Indium-Surfactant-Assisted Growth of High-Mobility AlN/GaN Multilayer Structures by Metalorganic Chemical Vapor Deposition", 2001 American Institute of Physics, Applied Physics Letters, vol. 79, No. 21, Nov. 19, 2001, pp. 3499-3451.

* cited by examiner

INDIUM SURFACTANT ASSISTED HVPE OF HIGH QUALITY GALLIUM NITRIDE AND GALLIUM NITRIDE ALLOY FILMS

This application claims the benefit of and priority to Provisional Application Ser. No. 61/230,451, filed Jul. 31, 2009 which is hereby incorporated by reference.

BACKGROUND OF THE INVENTION

1. Field of the Invention

Embodiments of the present invention describe method of manufacturing high quality low dislocation density gallium nitride and gallium nitride alloy films, such as aluminum gallium nitride (AlGaN).

2. Discussion of Related Art

Gallium nitride (GaN) and gallium nitride alloy films such as aluminum gallium nitride (AlGaN) films are finding greater importance in the development and fabrication of a variety of semiconductor devices, such as short wavelength light emitting diodes (LEDs), laser diodes (LD) and electronic devices, such as high electron mobility transistors (HEMTs), heterojunction bipolar transistors (HBTs). An important requirement forming these semiconductor devices is the fabrication of a suitable thick gallium nitride layer with a smooth surface and low dislocation density.

Presently, gallium nitride layers are formed by metal organic chemical vapor deposition (MOCVD) techniques and molecular beam expitaxial (MBE) techniques. Unfortunately, MOCVD and MBE techniques suffer from low growth rates and the use of expensive, low volume equipment.

What is desired, are methods for forming a gallium nitride (GaN) and gallium nitride alloy film, such as aluminum gallium nitride (AlGaN) at low cost and high growth rates to enable the cost effective production of low cost gallium nitride based high brightness LEDs for solid state lighting and full color displays.

SUMMARY

One embodiment of depositing a gallium nitride (GaN) film on a substrate comprises providing a source of indium (In) and gallium (Ga) and depositing a monolayer of indium (In) on the surface of the gallium nitride (GaN) film. The monolayer of indium (In) acts as a surfactant to modify the surface energy and facilitate the epitaxial growth of the film by suppressing three dimensional growth and enhancing or facilitating two dimensional growth. The deposition temperature is kept sufficiently high to enable the indium (In) to undergo absorption and desorption on the gallium nitride (GaN) film without being incorporated into the solid phase gallium nitride (GaN) film. The gallium (Ga) and indium (In) can be provided by a single source or separate sources.

DETAILED DESCRIPTION

Embodiments of the present invention describe a method of forming a high quality gallium nitride or gallium nitride alloy epitaxial film utilizing an indium (In) surfactant assisted hydride vapor phase epitaxial (HPVE) deposition process. The present invention has been described with respect to specific details in order to provide a thorough understanding of the invention. One of ordinary skill in the art will appreciate that the invention can be practiced without these specific details. In other instances, well known semiconductor processes and equipment have not been described in specific detail in order to not unnecessarily obscure the present invention.

Embodiments of the present invention describe a method of forming a high quality gallium nitride or gallium nitride alloy epitaxial film utilizing an indium (In) surfactant assisted hydride vapor phase epitaxial (HPVE) deposition process. In an embodiment of the present invention, a small amount of indium, such as between 1-10 atomic percent, is provided during the deposition process. A monolayer of indium floating on the surface of the deposited film facilitates the epitaxial growth of the gallium nitride film by suppressing three dimensional growth and enhancing or facilitating two dimensional growth. By keeping the deposition temperature sufficiently high, such as greater than 900° C., indium (In) undergoes an absorption and desorption process without being incorporated into the solid phase gallium nitride (GaN) film. Indium (In) forms a monolayer and acts as a surfactant modifying the surface energy and increasing the surface mobility of adsorbed atoms. In an embodiment of the present invention, indium is provided by creating an indium gallium (InGa) alloy source with approximately 1-10 atomic percent indium (In). Indium (In) is carried into the reactor through the same process as the gallium by reacting with halide or halogen based gas. In an alternative embodiment, separate indium and gallium sources are used.

Figure 1A:
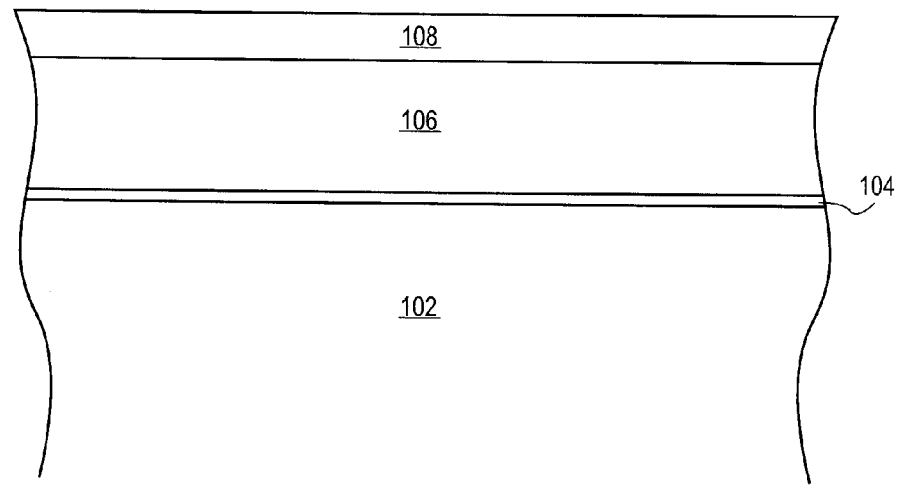
FIG. 1A is an illustration of a cross-sectional view of a gallium nitride (GaN) epitaxial film formed by HVPE utilizing an indium (In) assisted deposition process.

FIG. 1A illustrates a gallium nitride (GaN) single crystalline film 106 epitaxially grown on a substrate 102. An optional buffer layer 104, such as an aluminum nitride (AlN) layer, a gallium nitride (GaN) layer, or related ternary aluminum gallium nitride (AlGaN) or indium gallium nitride (InGaN) alloy layers, may be formed between the gallium nitride (GaN) film 106 and the substrate 102. Substrate 102 may be any suitable single crystalline substrate upon which a gallium nitride (GaN) single crystalline film 106 may be formed. Substrate 102 may be any suitable substrate, such as but not limited to a sapphire ($Al_2O_3$) substrate, a silicon substrate, a silicon carbide (SiC) substrate, a silicon on diamond (SOD) substrate, a quartz ($SiO_2$) substrate, a glass substrate, a zinc oxide (ZnO) substrate, a magnesium oxide (MgO) substrate and a lithium aluminum oxide ($LiAlO_2$) substrate. In a specific embodiment, substrate 102 is a (0001) sapphire substrate. Sapphire substrates are ideal for use in manufacturing of LEDs because they increase light extraction efficiency which is extremely useful in the fabrication of a new generation of solid state lighting devices. Gallium nitride (GaN) film 106 may be a gallium nitride (GaN) film containing only gallium nitride (GaN) or may be a gallium nitride (GaN) alloy film, such as for an example aluminum gallium nitride (AlGaN). In an embodiment of the present invention, the aluminum gallium nitride film has a composition of $Al_xGa_{1-x}N$ ($0 \leq x \leq 1$). The gallium nitride film or alloy film can have a thickness between 2-500 microns is typically formed between 2-15 microns. In an embodiment of the present invention, the gallium nitride film has a thickness of at least 3 microns to sufficiently suppress threading dislocations.

Additionally, gallium nitride (GaN) film 106 can be doped or undoped. In an embodiment of the present invention, gallium nitride (GaN) film 106 can be p typed doped using any suitable p type dopant such as but not limited Mg, Be, Ca, Sr, or any suitable Group I or Group II element having at least two valence electrons. In a specific embodiment of the present invention, gallium nitride (GaN) film 106 can be p type doped with magnesium (Mg) to a conductivity level of between $1\times10^{16}$ to $1\times10^{20}$ atoms/cm$^3$. In an embodiment of the present invention, gallium nitride (GaN) film 106 can be n type doped using any suitable n type dopant such as but not limited to Si, Ge, Sn, Pb, or any suitable Group IV, Group V, or Group VI element. In a specific embodiment of the present invention, gallium nitride (GaN) film 106 can be n type doped with silicon (Si) to a conductivity level of between $1\times10^{16}$ to $1\times10^{20}$ atoms/cm$^3$.

Buffer layer 104 may be any suitable Group III-nitride crystalline layer. Buffer layer 104 can be a binary, tenary or quaternary film comprising a solid solution of one or more Group III elements and nitrogen. Buffer layer 104 can provide a certain density of nucleation sites or islands facilitating the lateral growth of subsequent layers before the coalescence, which results in dramatic reduction of dislocation density and improvement of crystal quality, optical quality, and electrical quality. Buffer layer 104 is ideally formed by HVPE and in-situ (i.e. in the same chamber and without breaking vacuum) with gallium nitride film 106. Buffer layer 104 is not limited to native nitride materials, but other layers lattice-matched to the GaN layer can be used: such a ZnO, $LiAlO_2$ and SiC. Alternatively, buffer layer 104 may be formed in a separate chamber and/or by a different process, such as MOCVD or other physical vapor deposition or chemical vapor deposition methods. In an embodiment of the present invention, buffer layer 104 is formed to a thickness between 10-100 nanometers but the thickness can vary and, in some cases, it could be up to 0.5-1.0 μm.

An additional device layer or layers 108 may be formed on top of single crystalline gallium nitride layer 106 which are necessary for the fabrication of the desired semiconductor device, such as light emitting diodes (LEDs), laser diodes (LDs) or electronic devices, such as high electron mobility transistors (HEMTs), heterojunction bipolar transistors (HBTs), and quantum well devices. For example, in the fabrication of light emitting diodes (LEDs) additional device layers 108 may include LED device layers 112.

Figure 1B:
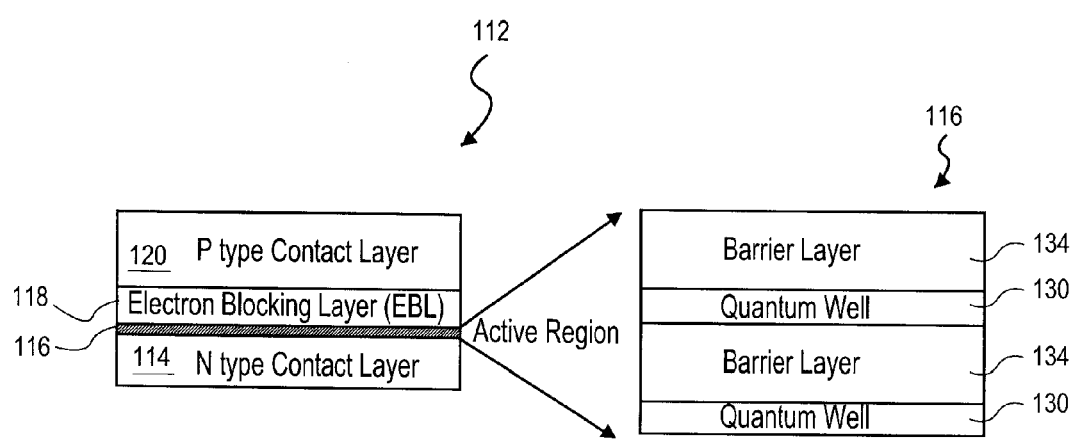
FIG. 1B is an illustration of example LED device layers that may be formed on a gallium nitride film.

FIG. 1B illustrates an example of LED device layers 112 which may include an n type contact layer 114, an active region 116, an electron blocking layer 118, and a p type contact layer 120. The active region 116 may comprise a plurality of active layers including a single or multiple quantum wells 130, such as indium gallium nitride (InGaN), formed on a single or multiple barrier layers 134, such as gallium nitride (GaN).

In an embodiment of the present invention, the gallium nitride (GaN) film 106 is formed by reacting a gallium containing precursor gas and a nitrogen containing precursor gas near the surface of the substrate 102 while also providing a small amount of an indium containing precursor gas. In one embodiment of the present invention, the gallium containing precursor gas and the indium containing precursor gas are formed by providing an indium gallium (InGa) alloy and then flowing a halide or halogen gas over the indium gallium (InGa) alloy. In an embodiment of the present invention, the indium gallium (InGa) alloy is a eutectic alloy. In another embodiment, HCl is reacted with the indium gallium (InGa) alloy to form gaseous gallium chloride (GaCl) and gaseous indium chloride (InCl). In another embodiment, chlorine gas ($Cl_2$) is reacted with the indium gallium (InGa) alloy to form gaseous gallium chloride (GaCl or $GaCl_3$) and indium chloride (InCl). Additional embodiments of the present invention utilize other halides or halogens to obtain the gallium containing precursor gas and the indium containing precursor gas. Suitable hydrides includes those with the composition HX (e.g. with X equal to Cl, Br or I) and suitable halogens include $Cl_2$, Br and $I_2$. In another embodiment of the present invention, instead of utilizing a single gallium indium (GaIn) alloy source, a separate gallium (Ga) source and a separate indium (In) source are provided.

In an embodiment of the present invention, a suitable amount of indium is provided to reduce the gallium nitride surface energy and modify the growth kinetics by decreasing the diffusion barrier of both gallium and nitrogen atoms. Additionally, a sufficient amount of indium is provided to create a monolayer of indium floating on the grown surface to affect the epitaxial growth by facilitating two dimensional growth (i.e. planar or horizontal growth) and by suppressing three dimensional growth (i.e. vertical growth). In an embodiment of the present invention, the amount of indium provided is kept sufficiently low so that it does not become incorporated into the film and form an indium gallium nitride (InGaN) compound film. In an embodiment of the present invention, an indium (In) to gallium (Ga) atomic ratio of 1-10% indium (In) to 90-99% gallium (Ga) is provided.

In embodiments of the present invention, the substrate is sufficiently heated to provide a growth temperature high enough in order to enable the indium to undergo absorption and desorption on the gallium nitride film without being incorporated into the solid phase gallium nitride film. In an embodiment of the present invention, the substrate is heated to a growth of temperature of greater than 900° C. In an embodiment of the present invention, the substrate is heated to a temperature between 900° C. and 1200° C. Additionally, in embodiments of the present invention, the chamber is maintained at a pressure between 100 torr and 760 torr. In one embodiment the chamber is maintained at a pressure between about 450 torr to about 760 torr. Such a deposition process deposits an epitaxial crystalline film on a substrate at a rate about 1 micron per hour to about 60 microns per hour. In one embodiment, the deposition rate is about 15 microns per hour to about 25 microns per hours.

An example of a HYPE deposition chamber which may be utilized to deposit the gallium nitride or gallium nitride alloy film in accordance with the present invention is illustrated and described with respect to FIGS. 2-9.

Figure 2:
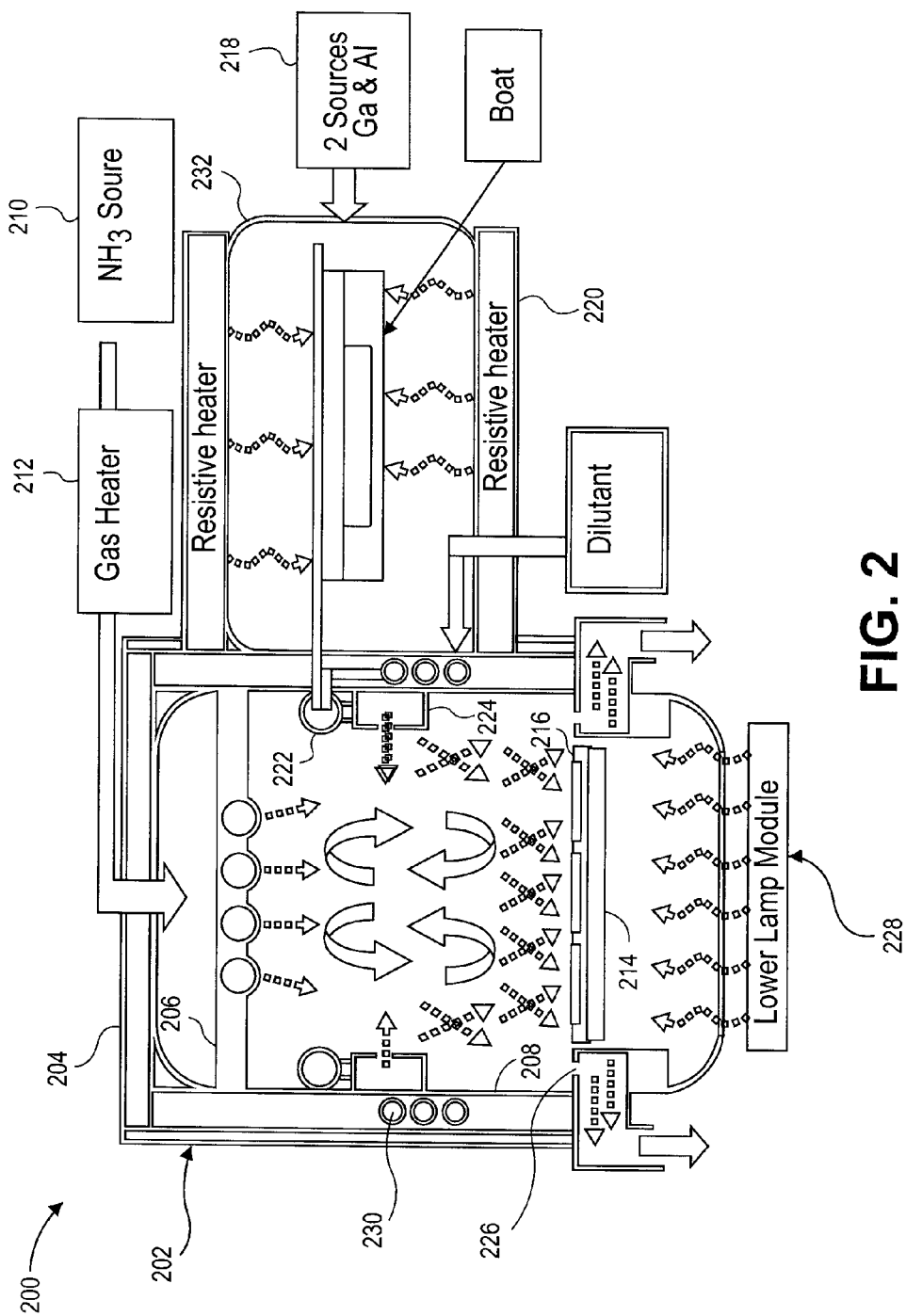
FIG. 2 is a schematic view of an HVPE apparatus 200 according to one embodiment.

FIG. 2 is a schematic view of an HVPE apparatus 200 according to one embodiment. The apparatus includes a chamber 202 enclosed by a lid 204. Processing gas from a first gas source 210 is delivered to the chamber 202 through a gas distribution showerhead 206. In one embodiment, the gas source 210 may comprise a nitrogen containing compound. In another embodiment, the gas source 210 may comprise ammonia. In one embodiment, an inert gas such as helium or diatomic nitrogen may be introduced as well either through the gas distribution showerhead 206 or through the walls 208 of the chamber 202. An energy source 212 may be disposed between the gas source 210 and the gas distribution showerhead 206. In one embodiment, the energy source 212 may comprise a heater. The energy source 212 may break up the gas from the gas source 210, such as ammonia, so that the nitrogen from the nitrogen containing gas is more reactive.

To react with the gas from the first source 210, precursor material may be delivered from one or more second sources 218. The one or more second sources 218 may comprise precursors such as gallium and aluminum. It is to be understood that while reference will be made to two precursors, more or less precursors may be delivered as discussed above. In one embodiment, the precursor comprises gallium present in the precursor source 218 in liquid form. In another embodiment, the precursor comprises aluminum present in the precursor source 218 in solid form. In one embodiment, the aluminum precursor may be in solid, powder form. The precursor may be delivered to the chamber 202 by flowing a reactive gas over and/or through the precursor in the precursor source 218. In one embodiment, the reactive gas may comprise a chlorine containing gas such as diatomic chlorine. The chlorine containing gas may react with the precursor source such as gallium or aluminum to form a chloride.

In order to increase the effectiveness of the chlorine containing gas to react with the precursor, the chlorine containing gas may snake through the boat area in the chamber 232 and be heated with the resistive heater 220. By increasing the residence time that the chlorine containing gas is snaked through the chamber 232, the temperature of the chlorine containing gas may be controlled. By increasing the temperature of the chlorine containing gas, the chlorine may react with the precursor faster. In other words, the temperature is a catalyst to the reaction between the chlorine and the precursor.

In order to increase the reactiveness of the precursor, the precursor may be heated by a resistive heater 220 within the second chamber 232 in a boat. For example, in one embodiment, the gallium precursor may be heated to a temperature of between about 750° C. to about 850° C. The chloride reaction product may then be delivered to the chamber 202. The reactive chloride product first enters a tube 222 where it evenly distributes within the tube 222. The tube 222 is connected to another tube 224. The chloride reaction product enters the second tube 224 after it has been evenly distributed within the first tube 222. The chloride reaction product then enters into the chamber 202 where it mixes with the nitrogen containing gas to form a nitride layer on the substrate 216 that is disposed on a susceptor 214. In one embodiment, the susceptor 214 may comprise silicon carbide. The nitride layer may comprise gallium nitride or aluminum nitride for example. The other reaction product, such as nitrogen and chlorine, are exhausted through an exhaust 226.

The chamber 202 may have a thermal gradient that can lead to a buoyancy effect. For example, the nitrogen based gas is introduced through the gas distribution showerhead 206 at a temperature between about 450° C. and about 550° C. The chamber walls 208 may have a temperature of about 600° C. to about 700° C. The susceptor 214 may have a temperature of about 1050° C. to about 1150° C. Thus, the temperature difference within the chamber 202 may permit the gas to rise within the chamber 202 as it is heated and then fall as it cools. The rising and falling of the gas may cause the nitrogen gas and the chloride gas to mix. Additionally, the buoyancy effect will reduce the amount of gallium nitride or aluminum nitride that deposits on the walls 208 because of the mixing.

The heating of the processing chamber 202 is accomplished by heating the susceptor 214 with a lamp module 228 that is disposed below the susceptor 214. During deposition, the lamp module 228 is the main source of heat for the processing chamber 202. While shown and described as a lamp module 228, it is to be understood that other heating sources may be used. Additional heating of the processing chamber 202 may be accomplished by use of a heater 230 embedded within the walls 208 of the chamber 202. The heater 230 embedded in the walls 208 may provide little if any heat during the deposition process. A thermocouple may be used to measure the temperature inside the processing chamber. Output from the thermocouple may be fed back to a controller that controls the heating of the heater 230 based upon the reading from the thermocouple. For example, if the chamber is too cool, the heater 230 will be turned on. If the chamber is too hot, the heater 230 is be turned off. Additionally, the amount of heating from the heater 230 may be controlled such that a low amount of heat is provided from the heater 230.

After the deposition process, the substrate 216 is normally taken out of the processing chamber 202. The lamp module 228 is turned off. Within the heat from the lamp module 228, the chamber 202 may rapidly cool. The gallium nitride or aluminum nitride that may have deposited on the walls 208 may have a different coefficient of thermal expansion than the walls 208 themselves. Thus, the gallium nitride or the aluminum nitride may flake off due to thermal expansion. To prevent undesired flaking, the heater 430 embedded within the chamber walls 208 may be turned on to control the thermal expansion and maintain the chamber 202 at the desired chamber temperature. The control of the heater 230 may again be based upon real time feedback from the thermocouple. Once the lamp module 228 is turned off, the heater 230 may be turned on or up to maintain the temperature of the chamber 202 at the desired temperature so that gallium nitride or aluminum nitride may not flake off and contaminate the substrate or land on the susceptor 214 and create an uneven susceptor 214 surface. By maintaining the chamber walls 208 at an elevated temperature, the chlorine will be more effective in cleaning the depositions from the chamber walls 208.

In general, a deposition process will proceed as follows. A substrate 216 may initially be inserted into the processing chamber 202 and disposed on the susceptor 214. In one embodiment, the substrate 216 may comprise sapphire. The lamp module 228 may be turned on to heat the substrate 216 and correspondingly the chamber 202. Nitrogen containing reactive gas may be introduced from a first source 210 to the processing chamber. The nitrogen containing gas may pass through an energy source 212 such as a gas heater to bring the nitrogen containing gas into a more reactive state. The nitrogen containing gas then passes through the chamber lid 204 and the gas distribution showerhead 206. In one embodiment, the chamber lid 204 may be water cooled.

A precursor may also be delivered to the chamber 202. A chlorine containing gas may pass through and/or over the precursor in a precursor source 218. The chlorine containing gas then reacts with the precursor to form a chloride. The chloride his heated in with a resistive heater 220 in the source module 232 and then delivered into an upper tube 222 where it evenly distributes within the tube 222. The chloride gas then flows down into the other tube 224 before it is introduced into the interior of the chamber 202. It is to be understood that while chlorine containing gas has been discussed, the invention is not to be limited to chlorine containing gas. Rather, other compounds may be used in the HVPE process. The chamber walls 218 may have a minimal amount of heat generated from the heater 230 embedded within the walls 218. The majority of the heat within the chamber 220 is generated by the lamp module 228 below the susceptor 214.

Due to the thermal gradient within the chamber 202, the chloride gas and the nitrogen containing gas rise and fall within the processing chamber 202 and thus intermix to form a nitride compound that deposited on the substrate 216. In addition to depositing on the substrate 216, the nitride layer may deposit on other exposed areas of the chamber 202 as well. The gaseous reaction produces of the chloride compound and the nitrogen containing gas may include chlorine and nitrogen which may be evacuated out of the chamber thought the exhaust 226.

Once the deposition process is completed, the lamp module 228 may be turned off and the heater 230 output may be increased. The substrate 216 may be removed. The heater 230 output reduces or eliminates thermal expansion and thus any deposited nitride material may remain in place until the desired cleaning time and not flake off of the walls 208 and land on the susceptor 214 of incoming/outgoing substrate 216. Once the deposition process is completed, any nitride that has deposited on the walls 208 may be removed by introducing an etchant to etch the nitride off of the walls 208. During the cleaning, the lamp module 228 may be turned off and the majority of the heat may be from the heater 230 embedded within the walls 208. Once a new substrate is placed into the chamber 202, the process may be repeated.

While the nitrogen containing gas is discussed as being introduced through the gas distribution showerhead 206 and the precursor delivered in the area corresponding to the middle of the chamber 202, it is to be understood that the gas introduced locations may be reversed. However, if the precursor is introduced through the showerhead 206, the showerhead 206 may be heated to increase the reactiveness of the chloride reaction product.

Because the chloride reaction product and the ammonia are delivered at different temperatures, delivering the ammonia and the chloride reaction product through a common feed may be problematic. For example, if a quartz showerhead were used to feed both the ammonia and the chloride reaction product, the quartz showerhead may crack due to the different temperatures of the ammonia and the chloride reaction product.

Additionally, the deposition process may involve depositing a thin aluminum nitride layer as a seed layer over the sapphire substrate followed by a gallium nitride layer. Both the gallium nitride and the aluminum nitride may be deposited within the same processing chamber. Thereafter, the sapphire substrate may be removed and placed into an MOCVD processing chamber were another layer may be deposited. In some embodiments, the aluminum nitride layer may be eliminated. Where both an aluminum nitride layer and a gallium nitride layer are deposited within the same chamber, a diatomic nitrogen back flow may be used to prevent any of the other precursor from reacting with chlorine and forming a chloride reaction product. The diatomic nitrogen may be flowed into the chamber of the precursor not being reacted while the chlorine may be flowed into contact with the other precursor. Thus, only one precursor is reacted at a time.

Figure 3:
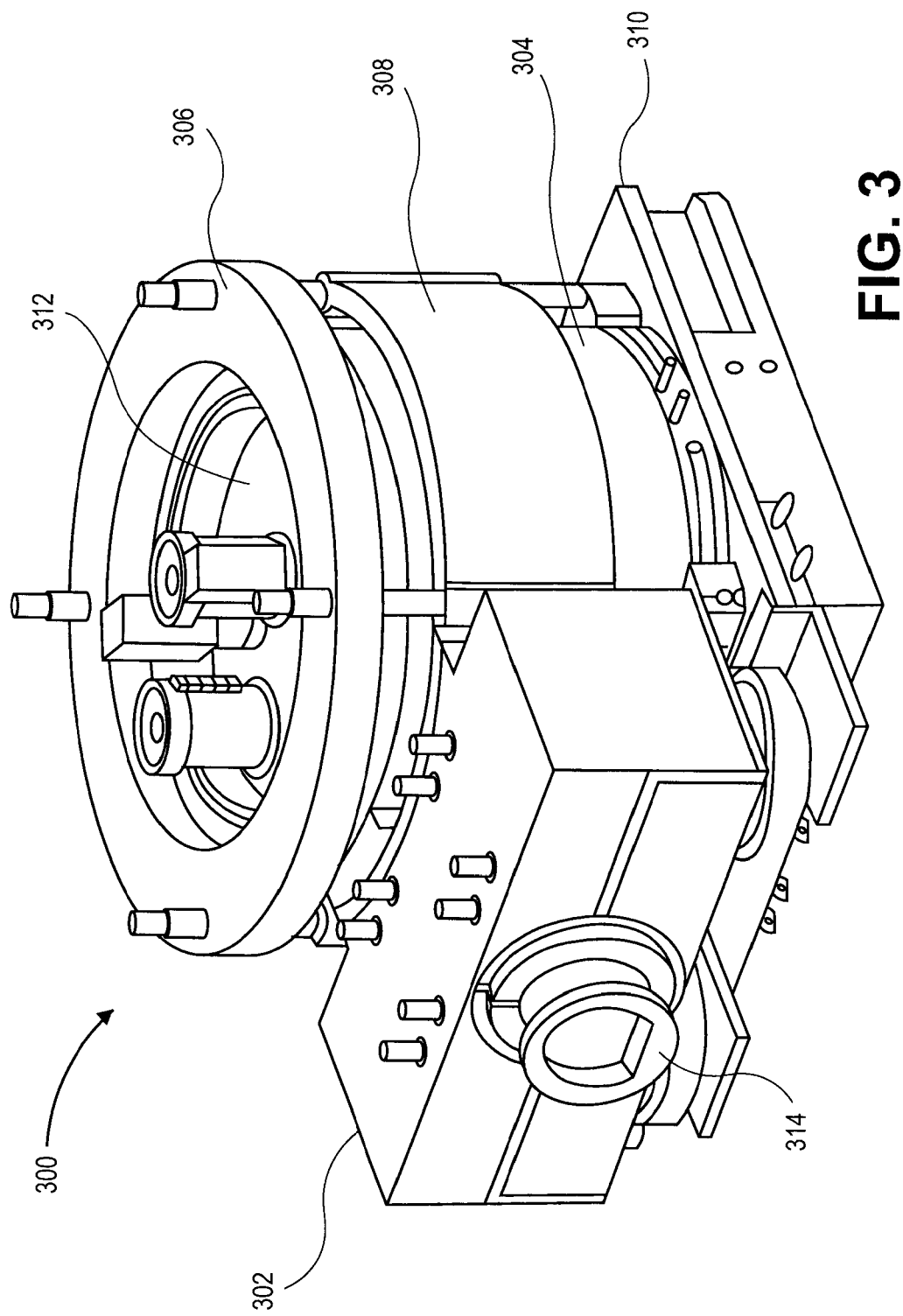
FIG. 3 schematic isometric view of an apparatus 300 according to another embodiment.

FIG. 3 schematic isometric view of an apparatus 300 according to another embodiment. The apparatus 300 includes a precursor source 302 or boat that is coupled to the chamber 304. The chamber 304 is enclosed by a lid 312 and held in place by a clamp 306, bottom 310 and enclosure 308. The chlorine containing gas is introduced to the precursor source 302 through a passageway 314. The chlorine containing gas snakes through the passageway 314 prior to coming into contact with the precursor so that the temperature of the chlorine containing gas may be raised to a predetermined temperature suitable to optimally react with the precursor.

Figure 4A:
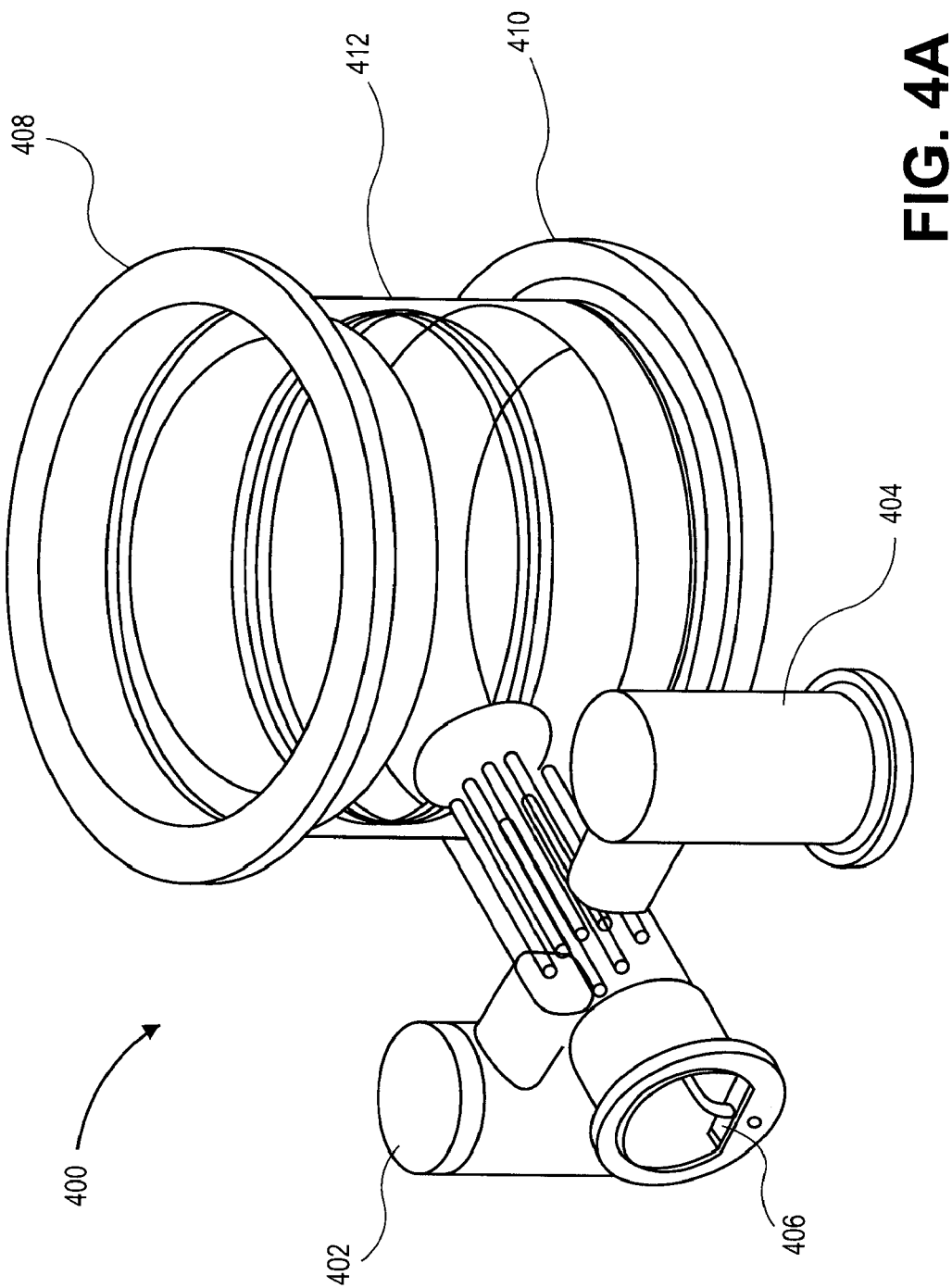
FIG. 4A is a schematic isometric view of a processing chamber 400 according to another embodiment.
Figure 4B:
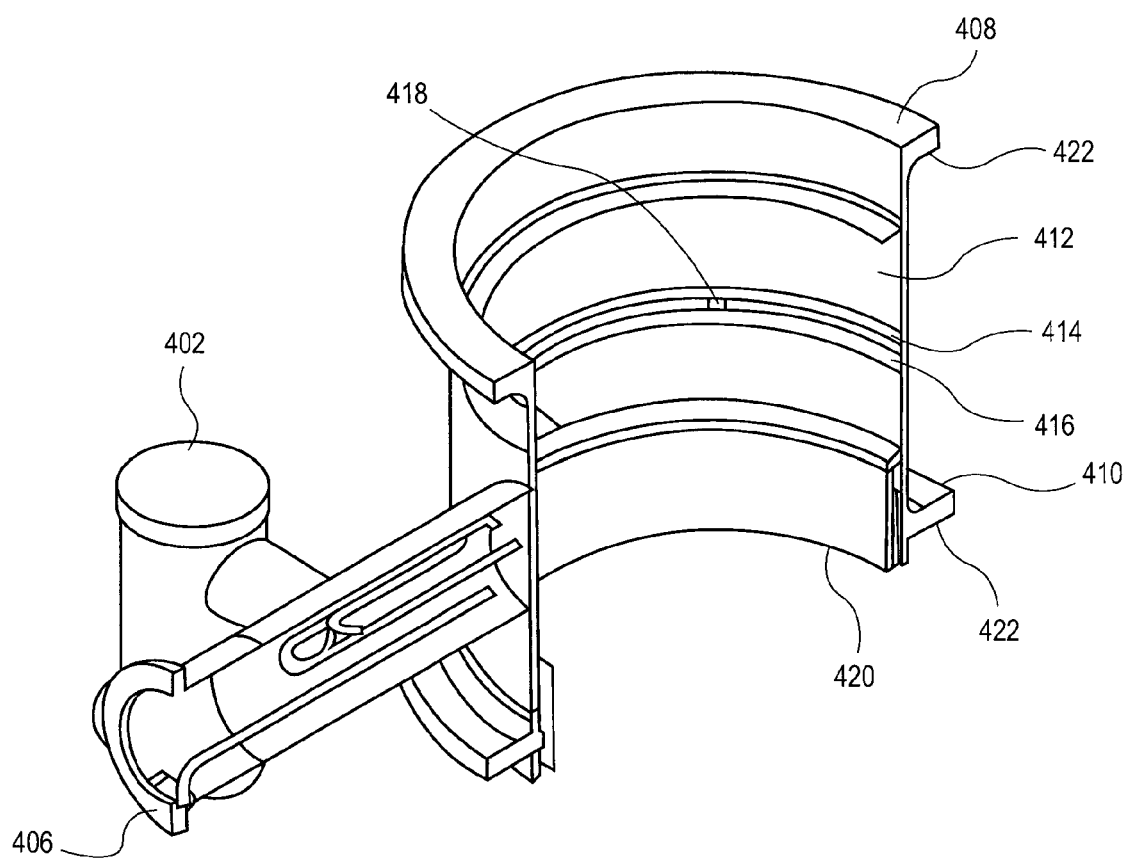
FIG. 4B is a schematic cross sectional view of FIG. 4A.

FIG. 4A is a schematic isometric view of a processing chamber 400 according to another embodiment. The processing chamber 400 includes a first precursor source 402, a second precursor source 404, a passageway 406 for the chlorine gas to pass, an upper ring 408, a lower ring 410, and sidewalls 412. FIG. 4B is a schematic cross sectional view of FIG. 4A. The chloride reaction produce may enter the chamber through a first upper tube 414 and then evenly distribute therein before flowing to a second tube 416 through connectors 418 that are distributed between the tubes 414, 416. In one embodiment, the upper and lower rings 408, 410 comprise opaque quartz. In one embodiment, the walls 412 may comprise clear quartz. In another embodiment, the tubes 414, 416 may comprise clear quartz. The lower liner 420 may comprise opaque quartz. The rings 408, 410 may have lips 422 that extend out from the walls 412. O-rings may be disposed out at the edge of the lips 422 to ensure that the O-rings are as far away from the heated chamber walls 412 and lamp module as possible. O-rings typically are usable up until about 250° C. Therefore, moving the O-rings away from the chamber body is beneficial.

Figure 5:
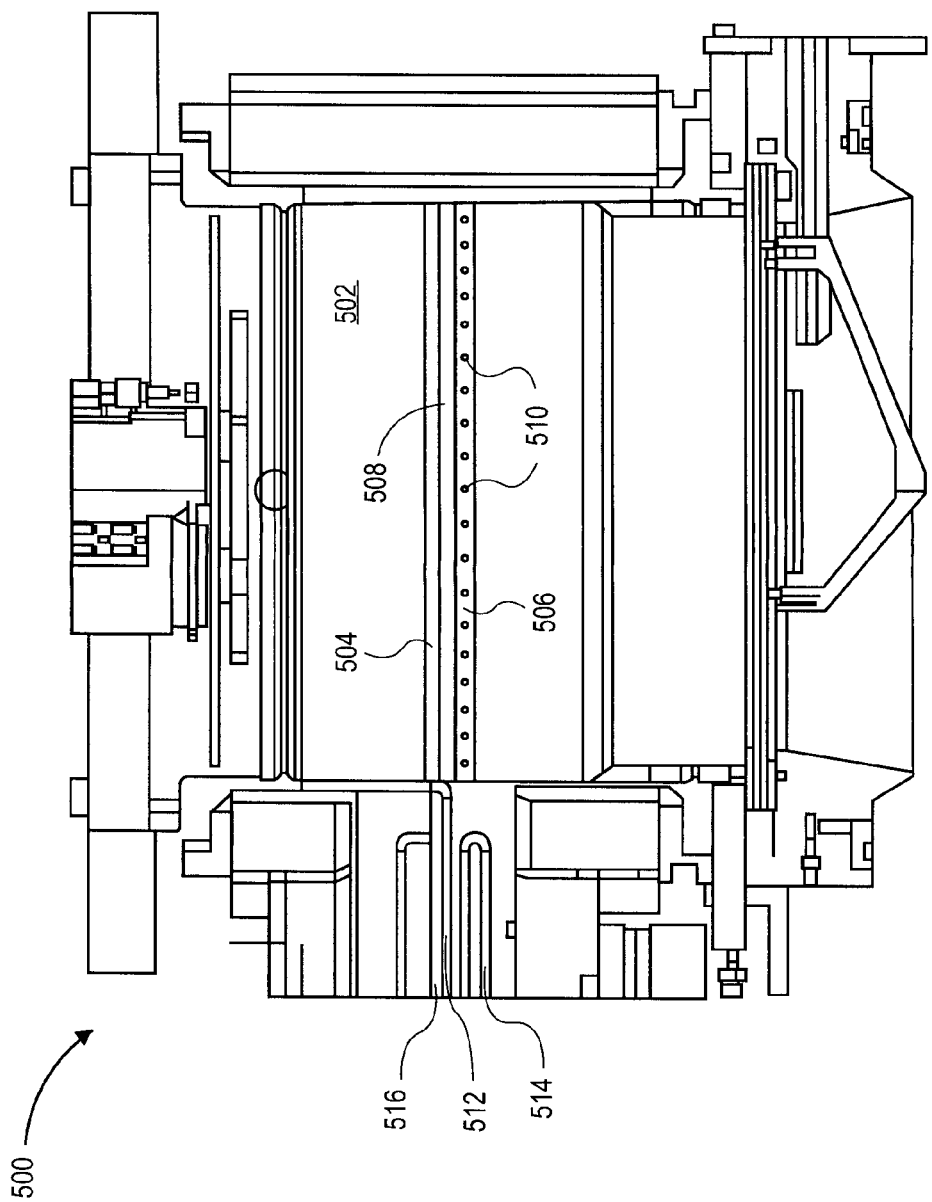
FIG. 5 is a schematic cross sectional view of a processing chamber 500 according to another embodiment.

FIG. 5 is a schematic cross sectional view of a processing chamber 500 according to another embodiment. The processing chamber 500 includes a chamber wall 502 having a first tube 504 coupled thereto. The first tube 504 is the tube into which the chloride reaction product initially flows before being released into the chamber. The tube 504 is coupled to a second tube 506 via one or more connectors 508. The tube 510 has a plurality of openings 510 therethrough to permit the chloride reaction product to enter into the processing space. The chloride gas is formed by initially introducing a chlorine containing gas into the precursor source or boat and flowed within the passage 516. The chlorine containing gas snakes around in the passage within tubes 514. The passage 516 is heated by the resistive heaters described above. Thus, the chlorine containing gas increases in temperature before coming into contact with the precursor. Once the chlorine comes into contact with the precursor, a reaction takes place to form a chloride reaction product that is flowed through the passage 516 in gas feed 512 that is coupled to the tube 514. Then, the chloride reaction product is evenly distributed and then disposed into the processing chamber 500.

Figure 6:
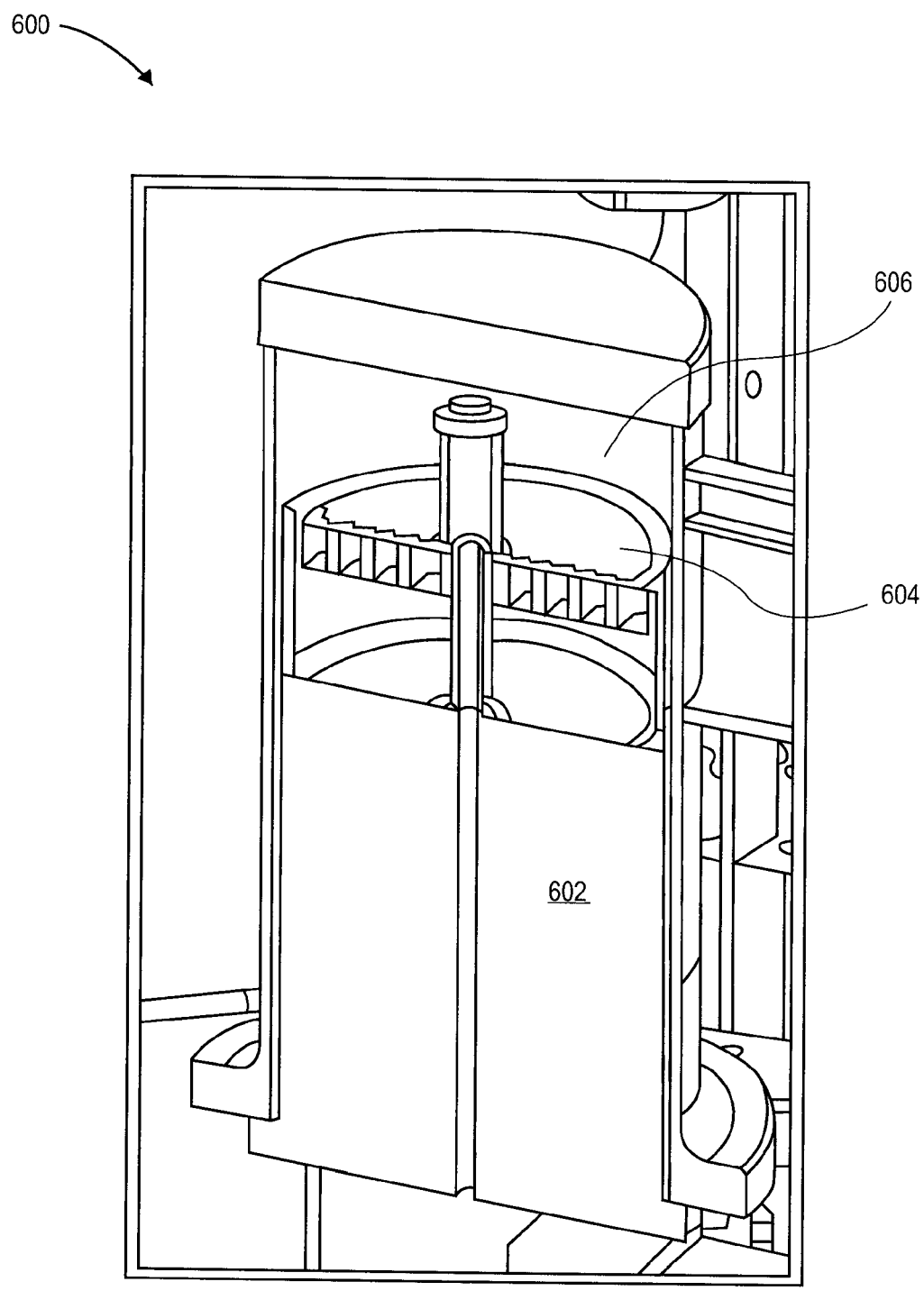
FIG. 6 is a schematic cross sectional view of a precursor source 600 according to one embodiment.

FIG. 6 is a schematic cross sectional view of a precursor source 600 according to one embodiment. In the embodiment discussed herein, the precursor is gallium, however, it is to be understood that the description is applicable to any liquid precursor. The precursor source 600 includes the precursor 602 itself with a float 604 thereon. The float 604 is the item that the chlorine gas flows through to come into contact with the precursor 602. As the chlorine comes into contact with the precursor, some of the precursor 602 will be used. Thus, the liquid level will drop over time. As such, the float 604 will move down and float on the precursor 602 such that the exposure of chlorine gas to the precursor 602 is substantially the same even as the level of the precursor 602 drops. The area 606 above the float 604 may increase as the precursor 602 decreases. The materials for the float 604 may comprise PbN to eliminate quartz exposure to gallium.

Figure 7:
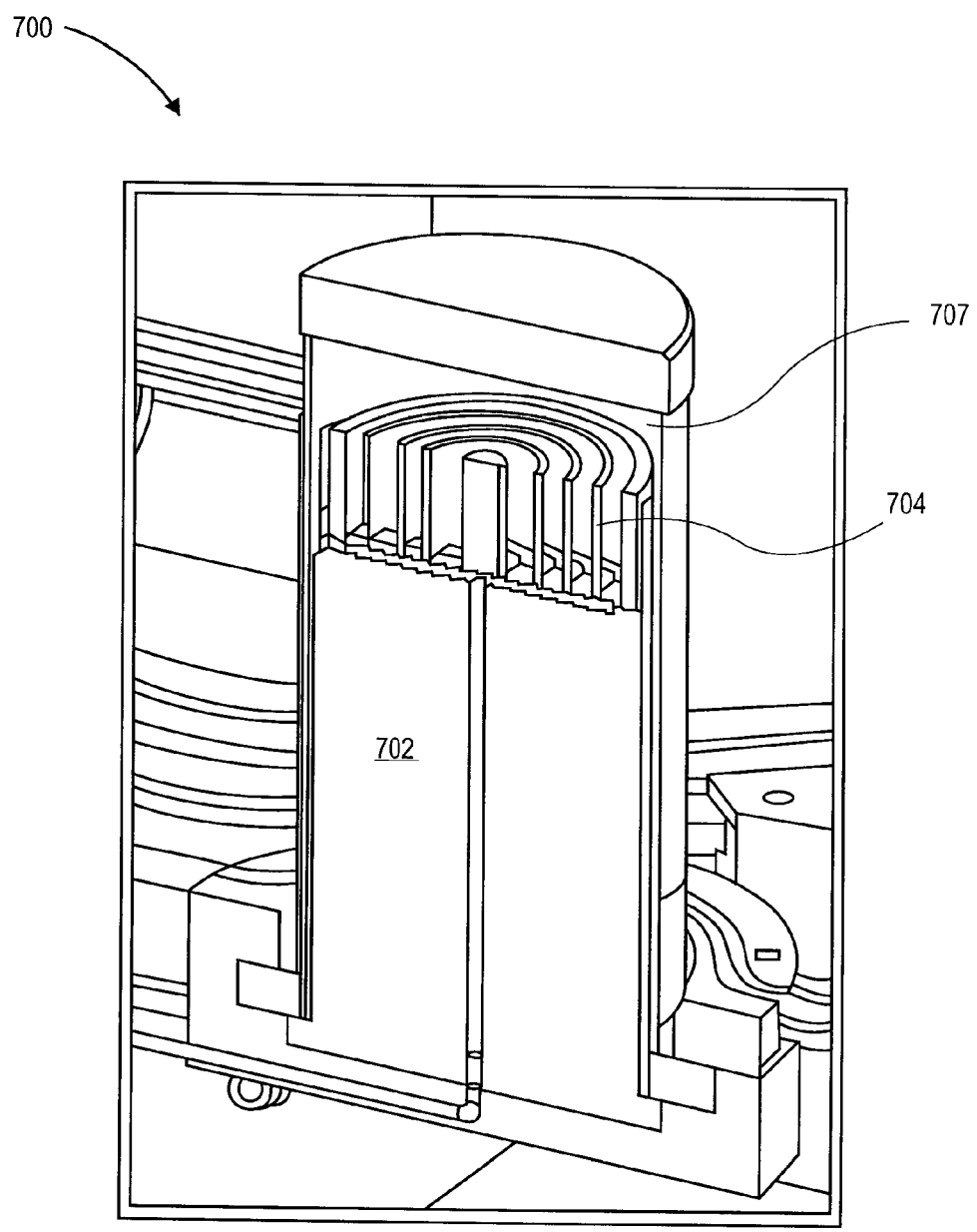
FIG. 7 is a schematic cross sectional view of a precursor source 700 according to another embodiment.

FIG. 7 is a schematic cross sectional view of a precursor source 700 according to another embodiment. While the description will be made with reference to a solid, powder aluminum precursor, it is to be understood that the precursor may be any solid precursor. The precursor 702 is below the labyrinth 704 through which the chlorine gas flows to come into contact with the precursor 702. The labyrinth increases the residence time that the chlorine gas is exposed to the precursor 702 so that an optimal amount of precursor 702 may be delivered to the processing chamber. As the labyrinth 704 is not a float, the area 706 above the labyrinth 704 is not expected to increase over time.

Figure 8:
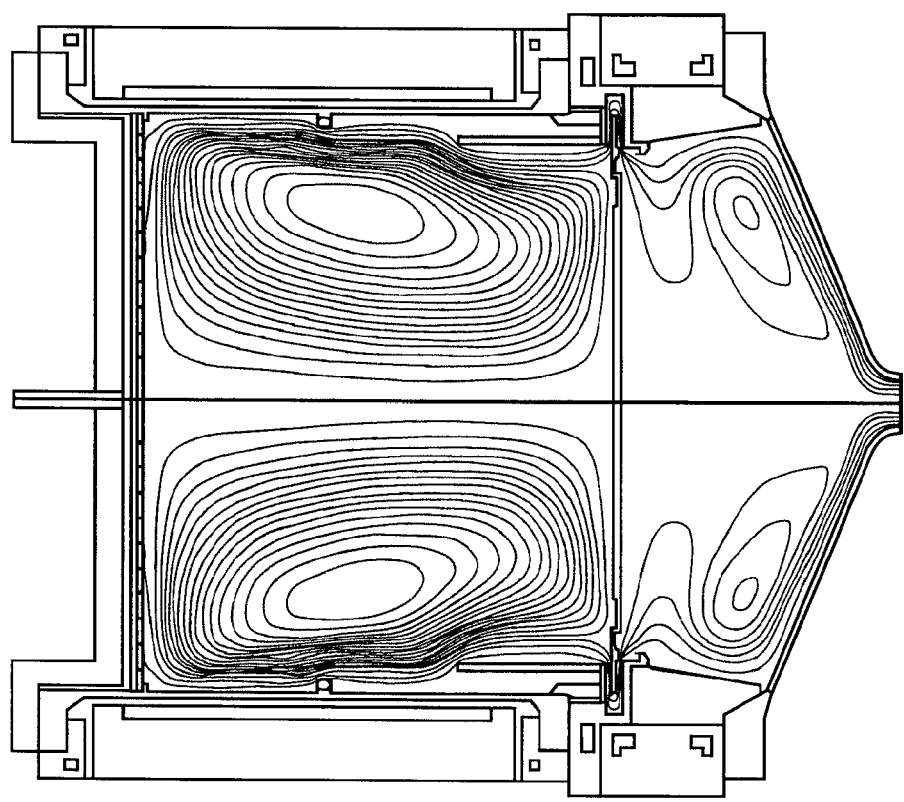
FIG. 8 is a schematic illustration of the buoyancy within the processing chamber according to one embodiment.
Figure 9:
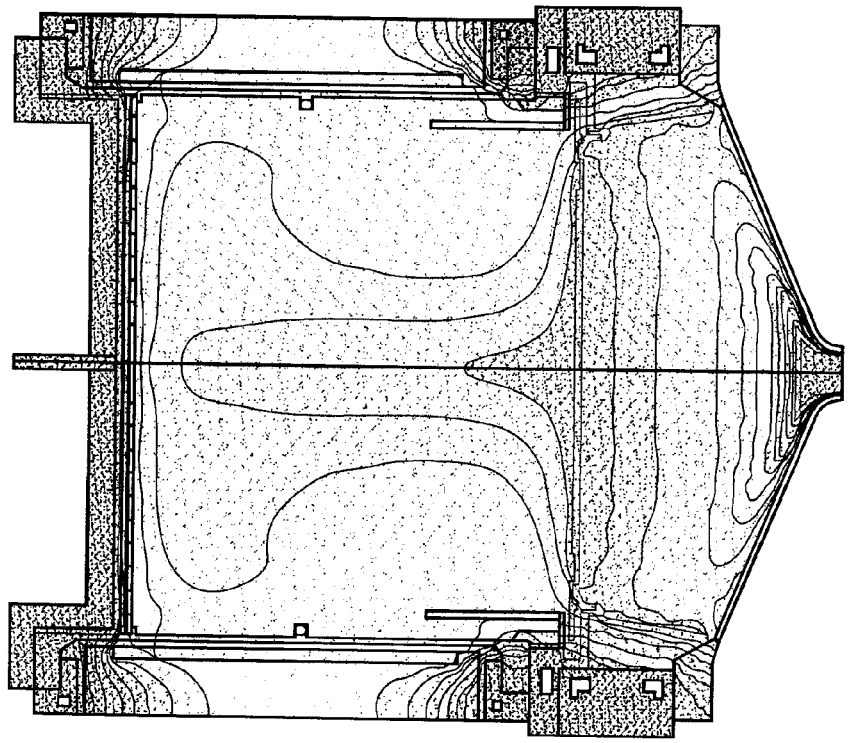
FIG. 9 is a schematic illustration of the heat distribution within the processing chamber according to one embodiment.
Figure 9:
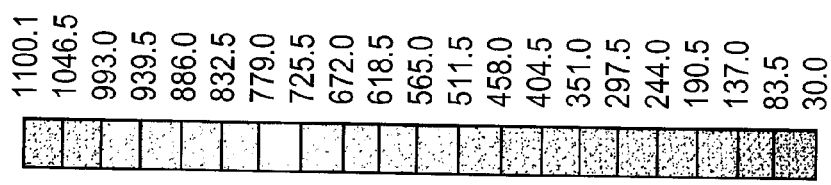

FIG. 8 is a schematic illustration of the buoyancy within the processing chamber according to one embodiment. As shown by the lines, the gas flow within the chamber is cyclical such that the gas rises from the bottom of the chamber, mixes, and then sinks towards the bottom of the chamber as the temperature has cooled. FIG. 8 is a schematic illustration of the heat distribution within the processing chamber according to one embodiment. As shown in FIG. 9, the temperature distribution is substantially symmetrical about an axis, but there is a temperature gradient from the bottom of the chamber to the top of the chamber.

The embodiments discussed herein relate to a hot wall HVPE CVD reactor design that minimizes wall deposition while any deposited films adhered to the chamber wall are adhered well enough to manage defects on the product substrate. The chamber is configured such that two reactive gases may be introduced separately at desired preheated temperatures. The gas injection was designed such that the two gases mix mainly away from the wall, but provide enough diffusion length, volume and buoyancy to ensure ideal premixing and produce high quality films.

The chamber design includes a hot wall HVPE reactor with multiple heating zones to manage the wall temperature and gradient, a bottom lamp for fast wafer temperature ramp up and down, a HVPE boat structure that interfaces directly to the chamber interior with optional dilution capabilities, and a chamber structure that promotes buoyancy flow. The chamber design permits a method to inject reactive gases into the main stream of the flow. The chamber design also includes a gas injection method to allow main gas mixing to occur in the gas volume away from the wall, a substrate heater for rapid temperate ramp up and down, a top heater for temperature gradient control, and a gas injection separated such that mixing and buoyancy effect are achieved. The apparatus also includes multiple metal sources heated by an independent heater and control, quartz or ceramic walls that incorporate the showerhead features. Helium may be used instead of nitrogen as the dilution gas to keep the gases at a higher temperature. The top ammonia/nitrogen gas or ammonia/helium gas can be heated to make the ammonia more reactive using a gas heater or heated labyrinth design with multiple plates. The top nitrogen source and the dilutant can be activated by an energy source such as a gas heater. The reactive gas may be flowed over the metal source boat that is preheated or activated with an energy source. The susceptor may be rotated for better gas distribution. A plate may be used to guide the gas mixture to the edge of the substrate. Also, the exhaust may be placed at the peripheral of the substrate or the upper part of the chamber where the heated gas may be exhausted.

Thus, a method of forming a high quality gallium nitride (GaN) film by an indium surfactant assisted HVPE growth has been described.

The invention claimed is:

1. A method of depositing a group III nitride film comprising:
   providing an In source and a Ga source;
   depositing a GaN film;
   depositing a monolayer of In on the surface of the GaN film; and
   heating the GaN film to a deposition temperature sufficiently high to prevent the In from being incorporated into the GaN film.

2. The method of claim 1, wherein the GaN film is deposited on a substrate.

3. The method of claim 2, wherein the substrate is selected from the group consisting of a sapphire substrate, a silicon carbide substrate, a silicon on diamond substrate, a quartz substrate, a glass substrate, a zinc oxide substrate, a magnesium oxide substrate, and a lithium aluminum oxide substrate.

4. The method of claim 1, wherein the atomic ratio of In to Ga is 1-10% In to 90-99% Ga.

5. The method of claim 1, wherein the deposition temperature is greater than 900° C.

6. The method of claim 1, wherein the In and the Ga are provided as a single source alloy.

7. The method of claim 1, wherein the In and the Ga are provided as separate sources.

8. The method of claim 1, wherein a buffer layer is deposited on top of the substrate, the GaN film is deposited on top of the buffer layer and one or more device layers are deposited on top of the GaN film.

* * * * *